(12) United States Patent
Shoji

(10) Patent No.: US 6,614,045 B2
(45) Date of Patent: Sep. 2, 2003

(54) IMAGING APPARATUS

(75) Inventor: Takashi Shoji, Kaisei-machi (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 37 days.

(21) Appl. No.: 09/833,808

(22) Filed: Apr. 13, 2001

(65) Prior Publication Data
US 2001/0030305 A1 Oct. 18, 2001

(30) Foreign Application Priority Data
Apr. 14, 2000 (JP) ........................... 2000-113944

(51) Int. Cl.⁷ ................................. G01T 1/16
(52) U.S. Cl. .......................... 250/591; 250/580
(58) Field of Search .................... 250/591, 315.3, 250/580, 370.09; 378/32, 28, 167, 186, 189

(56) References Cited

U.S. PATENT DOCUMENTS

| | | | |
|---|---|---|---|
| 4,446,365 A | * 5/1984 | Ong et al. | 250/370.09 |
| 5,268,569 A | 12/1993 | Nelson et al. | 250/214 |
| 5,661,309 A | * 8/1997 | Jeromin et al. | 250/370.09 |
| 5,925,890 A | 7/1999 | Van den Bogaert et al. | 250/580 |
| 6,282,264 B1 | * 8/2001 | Smith et al. | 378/167 |
| 6,376,857 B1 | * 4/2002 | Imai | 250/580 |

FOREIGN PATENT DOCUMENTS

| | | | |
|---|---|---|---|
| EP | 0 898 421 | 2/1999 | H04N/5/30 |
| EP | 0 989 730 | 3/2000 | H04N/1/00 |
| EP | 1 041 400 | 10/2000 | G01T/1/24 |
| JP | 9-5906 | 1/1997 | G03B/42/02 |
| JP | 11-87922 | 3/1999 | H05K/3/46 |
| JP | 2000-105297 | 4/2000 | G21K/4/00 |
| JP | 2000-162726 | 6/2000 | G03B/42/02 |
| JP | 2000-284056 | 10/2000 | G01T/1/24 |
| WO | 98/59261 | 12/1998 | G01T/1/24 |

* cited by examiner

Primary Examiner—Constantine Hannaher
Assistant Examiner—Albert Gagliardi
(74) Attorney, Agent, or Firm—Sughrue Mion, PLLC (57) ABSTRACT

A planar image detector records image information as an electrostatic latent image and generates electric currents in accordance with the latent image when the image detector is scanned with a reading electromagnetic wave. A pre-exposure light source section irradiates an electromagnetic wave to an entire area of the image detector before the recording of the latent image. A reading exposure light source section located between the image detector and the pre-exposure light source section produces the reading electromagnetic wave and scans the image detector with the reading electromagnetic wave. Current detector detects the currents flowing out of the image detector in accordance with the latent image when the image detector is scanned with the reading electromagnetic wave. All of the elements described above are accommodated within a single same case housing.

9 Claims, 8 Drawing Sheets

X-Z CROSS SECTION

FIG. 5C

X-Y CROSS SECTION

IMAGING APPARATUS

BACKGROUND OF THE INVENTION

1. Field of the Invention

This invention relates to an imaging apparatus. This invention particularly relates to an imaging apparatus, which is provided with an imaging device (an image detector) for recording an image as an electrostatic latent image.

2. Description of the Related Art

Apparatuses utilizing image detectors, e.g. facsimile apparatuses, copying machines, and radiation image sensors, have heretofore been known.

Methods and apparatuses for recording and reading out radiation image information by utilizing image detectors have heretofore been proposed. With the proposed methods and apparatuses for recording and reading out radiation image information, such that a radiation dose delivered to an object during a medical X-ray image recording operation maybe kept small, and such that the image quality of an image and its capability of serving as an effective tool in, particularly, the efficient and accurate diagnosis of an illness maybe enhanced, a solid-state radiation detector (an electrostatic recording material), which is provided with a photo-conductive material sensitive to radiation (such as X-rays), e.g. a selenium plate constituted of a-Se, or the like, is employed as an image detector. The solid-state radiation detector is exposed to radiation, such as X-rays, carrying radiation image information, and electric charges occurring in an amount proportional to the dose of the radiation delivered to the solid-state radiation detector are accumulated as latent image charges in a charge accumulating section formed within the solid-state radiation detector. In this manner, the radiation image information is recorded as an electrostatic latent image at the charge accumulating section. Thereafter, the solid-state radiation detector, on which the radiation image information has been recorded, is scanned with a laser beam or line light acting as reading light, and the radiation image information is thereby read out from the solid-state radiation detector. The methods and apparatuses for recording and reading out radiation image information by utilizing image detectors are described in, for example, U.S. Pat. No. 5,268,569, PCT International Publication No. WO 98/59261, Japanese Unexamined Patent Publication No. 9(1997)-5906, and Japanese Patent Application Nos. 10(1998)-232824, 11(1999)-242876, and 11(1999)-87922.

As described above, various electrostatic recording materials have heretofore been proposed as the image detectors. However, as for the technique for scanning the image detector with a reading electromagnetic wave and thereby reading out the electrostatic latent image from the image detector, no example has heretofore been disclosed wherein the technique is applied to a more practical apparatus.

For example, in the cases of a chest image recording apparatus, an image recording section of the chest image recording apparatus is moved vertically to a position matching with the position of an object, and an image recording operation is performed in this state. Therefore, it is necessary for the image detector acting as the image recording section to be capable of being moved vertically. Accordingly, in order for the image detector to be utilized practically in the chest image recording apparatus, or the like, it is necessary that the chest image recording apparatus, or the like, utilizing the image detector be small in size. Also, in cases where the image recording apparatus is to be utilized as a portable image recording apparatus, it is necessary that the image recording apparatus be small in size and portable.

Further, in cases where an image recording operation and an image read-out operation are to be performed by utilizing the a-Se photo-conductive material, such that a high radiation absorptivity may be obtained and such that an image with a high signal-to-noise ratio maybe obtained, a high voltage (of at least 1 kV) must be applied across the photo-conductive material. Specifically, in an ordinary image recording operation, it is necessary for the film thickness of the a-Se photo-conductive material to be at least approximately 500 $\mu$m. In such cases, in order for an electric field intensity in the film to be kept, a voltage of at least 5 kV should preferably be applied across the photo-conductive material. Therefore, it is necessary for a high-voltage electric power source to be utilized for the image recording operation and the image read-out operation. However, in cases where a high voltage is applied across the image detector, if electrical insulation between a hot side and a grounding side is not good, arc discharge will occur, and reliability of a discharging section will become markedly low. Furthermore, strong noise will occur and will adversely affect the equipment. In cases where the image detector is to be utilized in the practical apparatus, it may be considered that the high-voltage electric power source located at the exterior of the apparatus be connected to the image detector via a cord and a connector. However, since the problems described above are encountered, the problems occur in that a special cord and a special connector must be utilized, and the cost of the apparatus cannot be kept low.

SUMMARY OF THE INVENTION

The primary object of the present invention is to provide an imaging apparatus provided with an image detector, which records image information as an electrostatic latent image and which generates an electric current in accordance with the recorded electrostatic latent image when being scanned with a reading electromagnetic wave, wherein the imaging apparatus is small in size.

Another object of the present invention is to provide an imaging apparatus, which is cheap in cost.

The present invention provides a first imaging apparatus, comprising:

i) a planar image detector, which records image information as an electrostatic latent image, and which generates electric currents in accordance with the electrostatic latent image when the planar image detector is scanned with a reading electromagnetic wave, ii) a pre-exposure light source section, which is located at a position facing the planar image detector, and which irradiates a predetermined amount of an electromagnetic wave to an entire area of the planar image detector before the electrostatic latent image is recorded on the planar image detector, iii) a reading exposure light source section, which is located between the planar image detector and the pre-exposure light source section, and which produces the reading electromagnetic wave and scans the planar image detector with the reading electromagnetic wave, and iv) current detecting means for detecting the currents flowing out of the planar image detector in accordance with the electrostatic latent image, which has been recorded on the planar image detector, when the planar image detector is scanned with the reading electromagnetic wave, the planar image detector, the pre-exposure light source section, the reading exposure light source section, and the current detecting means being accommodated within a single same case housing.

The present invention also provides a second imaging apparatus, comprising:

i) a planar image detector, which records image information as an electrostatic latent image, and which generates electric currents in accordance with the electrostatic latent image when the planar image detector is scanned with a reading electromagnetic wave, ii) a pre-exposure light source section, which irradiates a predetermined amount of an electromagnetic wave to an entire area of the planar image detector before the electrostatic latent image is recorded on the planar image detector, iii) a reading exposure light source section, which produces the reading electromagnetic wave and scans the planar image detector with the reading electromagnetic wave, and iv) current detecting means for detecting the currents flowing out of the planar image detector in accordance with the electrostatic latent image, which has been recorded on the planar image detector, when the planar image detector is scanned with the reading electromagnetic wave, the planar image detector, the pre-exposure light source section, the reading exposure light source section, and the current detecting means being accommodated within a single same case housing, the reading exposure light source section also acting as the pre-exposure light source section.

The term "image detector" as used herein means the device capable of recording image information as an electrostatic latent image and generating electric currents in accordance with the electrostatic latent image when being scanned with the reading electromagnetic wave. By way of example, the image detector may be the electrostatic recording material described in Japanese Patent Application No. 10(1998)-232824. As the image detector, an image detector may be employed, which is capable of recording image information as an electrostatic latent image when being exposed to light (not limited to visible light) carrying the image information. Alternatively, an image detector may be employed, which is capable of recording radiation image information as an electrostatic latent image when being exposed to radiation carrying the radiation image information of an object.

The reading electromagnetic wave may be one of various kinds of electromagnetic waves, with which the electrostatic latent image is capable of being read out from the image detector. Specifically, the reading electromagnetic wave may be light, radiation, or the like. Therefore, the term "light source" as used herein means both the light source for producing light acting as the reading electromagnetic wave and the radiation source for producing radiation acting as the reading electromagnetic wave.

The term "pre-exposure light source section" as used herein means the light source section for irradiating the electromagnetic wave to the image detector in order to eliminate unnecessary electric charges accumulated in the image detector (i.e., for performing pre-exposure) before the recording light is irradiated to the image detector (as described in Japanese Patent Application No. 10(1998)-232824), or the light source section for performing primary exposure in order to conduct pre-charging (i.e., for performing pre-exposure) before final recording is performed. The wavelengths of the pre-exposure electromagnetic wave may be identical with the wavelengths of the reading electromagnetic wave, or may be different from the wavelengths of the reading electromagnetic wave.

Each of the first and second imaging apparatuses in accordance with the present invention should preferably be modified such that a high-voltage electric power source for applying a high voltage of at least 1 kV across the image detector is located within the case housing, and the high-voltage electric power source is located in the vicinity of a connecting position of a grounding side and a connecting position of a hot side.

Also, the first imaging apparatus in accordance with the present invention, wherein the pre-exposure light source section and the reading exposure light source section are provided as two independent light source sections, should preferably be modified such that the pre-exposure light source section comprises:

a) a pre-exposure light source for producing the electromagnetic wave, b) a reflecting plate located on one side of the pre-exposure light source, which one side is opposite to the side facing the image detector, the reflecting plate reflecting the electromagnetic wave toward the image detector, and c) a surface-shaped filter, which is located between the pre-exposure light source and the reading exposure light source section and which transmits the electromagnetic wave having predetermined wavelengths.

Further, in the first imaging apparatus in accordance with the present invention, as the reading exposure light source section, a light source section for performing the scanning with a laser beam, a light source section for performing the scanning with line light, or the like, may be utilized. In particular, the first imaging apparatus in accordance with the present invention should preferably be modified such that the reading exposure light source section comprises:

a) a reading exposure light source, which is provided with a plurality of light emission points arrayed linearly, and b) first optical means, which comprises a slit member having an opening area and an optical member for converging the reading electromagnetic wave to the opening area of the slit member, and which spatially filters the reading electromagnetic wave having been radiated out from each of the light emission points of the reading exposure light source, and the reading exposure light source section operates such that the reading electromagnetic wave, which has been radiated out from each of the light emission points and has then passed through the first optical means, diffuses in a longitudinal direction of the reading exposure light source and impinges upon the image detector, and such that several reading electromagnetic wave beams, which have been radiated out from several light emission points among the plurality of the light emission points, simultaneously impinge upon an identical site on the image detector.

In such cases, the opening area of the slit member should preferably extend in the longitudinal direction of the reading exposure light source, and the optical member should preferably converge the reading electromagnetic wave, which has been radiated out from each of the light emission points, with respect to a direction normal to the longitudinal direction of the reading exposure light source. Also, the reading exposure light source section should preferably further comprises second optical means for converging the reading electromagnetic wave, which has passed through the first optical means, with respect to the direction normal to the longitudinal direction of the reading exposure light source.

The optical member of the first optical means described above may be constituted of SELFOC lenses, and the second optical means may be constituted of cylindrical lenses. Alternatively, the optical member of the first optical means may be constituted of cylindrical lenses, and the second optical means may be constituted of cylindrical lenses. Also, the reading exposure light source may comprise a plurality of LED chips arrayed linearly or a plurality of LD chips arrayed linearly. Alternatively, the reading exposure light source may be constituted of an LED array or an LD array.

Furthermore, the first imaging apparatus in accordance with the present invention should preferably be modified such that the image detector is supported by a surface-shaped base plate having permeability to light, the base plate being located on the side of one surface of the image detector, which one surface stands facing the pre-exposure light source section.

Also, each of the first and second imaging apparatuses in accordance with the present invention should preferably be modified such that a scattered ray removing grid is located at a position within the case housing, which position stands facing a side of the image detector opposite to a side facing the pre-exposure light source section.

Further, each of the first and second imaging apparatuses in accordance with the present invention may be modified such that the apparatus further comprises a support post for image recording, and the case housing is supported by the support post for image recording such that the case housing is capable of being moved vertically.

Each of the first and second imaging apparatuses in accordance with the present invention, which are modified in such a manner, may be utilized for the recording of a chest image.

Furthermore, each of the first and second imaging apparatuses in accordance with the present invention may be modified such that the apparatus further comprises a support post for image recording, and a moving section supported by the support post for image recording such that the moving section is capable of being moved at least in one direction, which is among a vertical direction, a rotating direction, a horizontal direction, and a forward-reverse direction, and the case housing is supported by the moving section (such as a U-arm or a C-arm).

With each of the first and second imaging apparatuses in accordance with the present invention, the image detector, the pre-exposure light source section, the reading exposure light source section, and the current detecting means are accommodated within the single same case housing. Therefore, the size of the imaging apparatus as a whole is capable of being kept smaller than the size of an imaging apparatus wherein an image detector, a pre-exposure light source section, a reading exposure light source section, and a current detecting means are accommodated within different case housings. Since each of the first and second imaging apparatuses in accordance with the present invention is formed compactly as the single case housing, the imaging apparatus is capable of being carried and moved easily and is suitable for use in practice.

Also, in cases where a high-voltage electric power source is located on the side outward from the case housing, a special connector and a cable must be utilized. Since the special connector, or the like, is expensive, the cost of the apparatus as a whole cannot be kept low. However, with each of the first and second imaging apparatuses in accordance with the present invention, wherein the high-voltage electric power source is located with in the case housing and in the vicinity of the connecting position of the high-voltage electric power source, the special connector described above need not be utilized, and the length of a cable is capable of being kept short. Therefore, the cost of the imaging apparatus as a whole is capable of being kept low.

The first imaging apparatus in accordance with the present invention, may be modified such that the pre-exposure light source section comprises (a) the pre-exposure light source for producing the electromagnetic wave, (b) the reflecting plate located on one side of the pre-exposure light source, which one side is opposite to the side facing the image detector, the reflecting plate reflecting the electromagnetic wave toward the image detector, and (c) the surface-shaped filter, which is located between the pre-exposure light source and the reading exposure light source section and which transmits the electromagnetic wave having predetermined wavelengths. In such cases, the pre-exposure of the image detector is capable of being performed efficiently. Also, with the pre-exposure, an image signal having a high signal-to-noise ratio is capable of being obtained.

In cases where a reading exposure light source section comprises a reading exposure light source, which is provided with a plurality of light emission points arrayed linearly, and an imaging apparatus may be constituted such that, for example, the light emission points and exposure points (read-out pixels) on an image detector correspond in a one-to-one relation to each other. In such cases, if the reading exposure light source is constituted of N number of light emission points, each of which corresponds to one exposure point on the image detector, and if it is defined that the imaging apparatus becomes inoperable when one of the light emission points malfunctions, a failure rate of the imaging apparatus will be represented by the formula shown below.

(Failure rate of apparatus)=(failure rate of light emission points)×$N$

Also, in such cases, if a mean variation of light emission amounts at light emission points is A% (and the areas of the exposure points are identical), a variation of exposure amounts at the exposure points on the image detector becomes equal to A%.

However, with the first imaging apparatus in accordance with the present invention, wherein the reading exposure light source section comprises the reading exposure light source, which is provided with the plurality of the light emission points arrayed linearly, and the reading exposure light source section operates such that several reading electromagnetic wave beams, which have been radiated out from several light emission points among the plurality of the light emission points, simultaneously impinge upon an identical site on the image detector, every exposure point on the image detector is uniformly exposed to the reading electromagnetic wave beams, which have been radiated out from, for example, M number of light emission points (M≧2). Therefore, even if one of the light emission points malfunctions and no electromagnetic wave is radiated out from the one light emission point, the exposure amount will decrease only by 1/M, and the malfunction of one light emission point does not directly cause a failure of the entire imaging apparatus to occur. Accordingly, the failure rate is capable of being kept lower than in the example of the imaging apparatus described above wherein the light emission points and exposure points correspond in a one-to-one relation to each other.

Further, in cases where the variation of the light emission amounts at the light emission points is A% (and the areas of the exposure points are identical), since each of the exposure points on the image detector is exposed to the reading electromagnetic wave beams, which have been radiated out from M number of light emission points, the mean variation of the exposure amounts at the exposure points on the image detector becomes equal to A/M% and thus becomes lower than in the example of the imaging apparatus described above wherein the light emission points and exposure points correspond in a one-to-one relation to each other.

Specifically, with the reading exposure light source section in the imaging apparatus in accordance with the present invention, the failure rate and the variation of the exposure amounts are capable of being kept low. Therefore, when a recorded image is read out, an image free from artifacts is capable of being obtained.

Furthermore, in cases where a service life and performance at least identical with the service life and performance of the conventional reading exposure light source section are to be exhibited, the service life of light emitting devices need not be so long as the service life of the light emitting devices employed in the conventional reading exposure light source section, and specifications with respect to the variation of the amounts of light radiated out from the light emitting devices may not be so strict as in the conventional reading exposure light source section. Therefore, the production yield of the light emitting devices is capable of being enhanced, and the cost of the imaging apparatus as a whole is capable of being kept low.

Also, the image detector may be supported by the surface-shaped base plate having permeability to light and an appropriate strength, the base plate being located on the side of one surface of the image detector, which one surface stands facing the pre-exposure light source section. In such cases, when the image detector, which is ordinarily formed on a markedly thin glass substrate, is located vertically, the image detector does not bend, and the image sharpness is capable of being kept high.

Further, the scattered ray removing grid may be located at the position within the case housing, which position stands facing the side of the image detector opposite to the side facing the pre-exposure light source section. In such cases, the scattered ray removing grid is capable of being combined compactly with the imaging apparatus. Also, the problems are capable of being prevented from occurring in that the image quality becomes bad due to radiation (scattered light) having been scattered by an object.

DESCRIPTION OF THE PREFERRED EMBODIMENTS

The present invention will hereinbelow be described in further detail with reference to the accompanying drawings.

Figure 1:
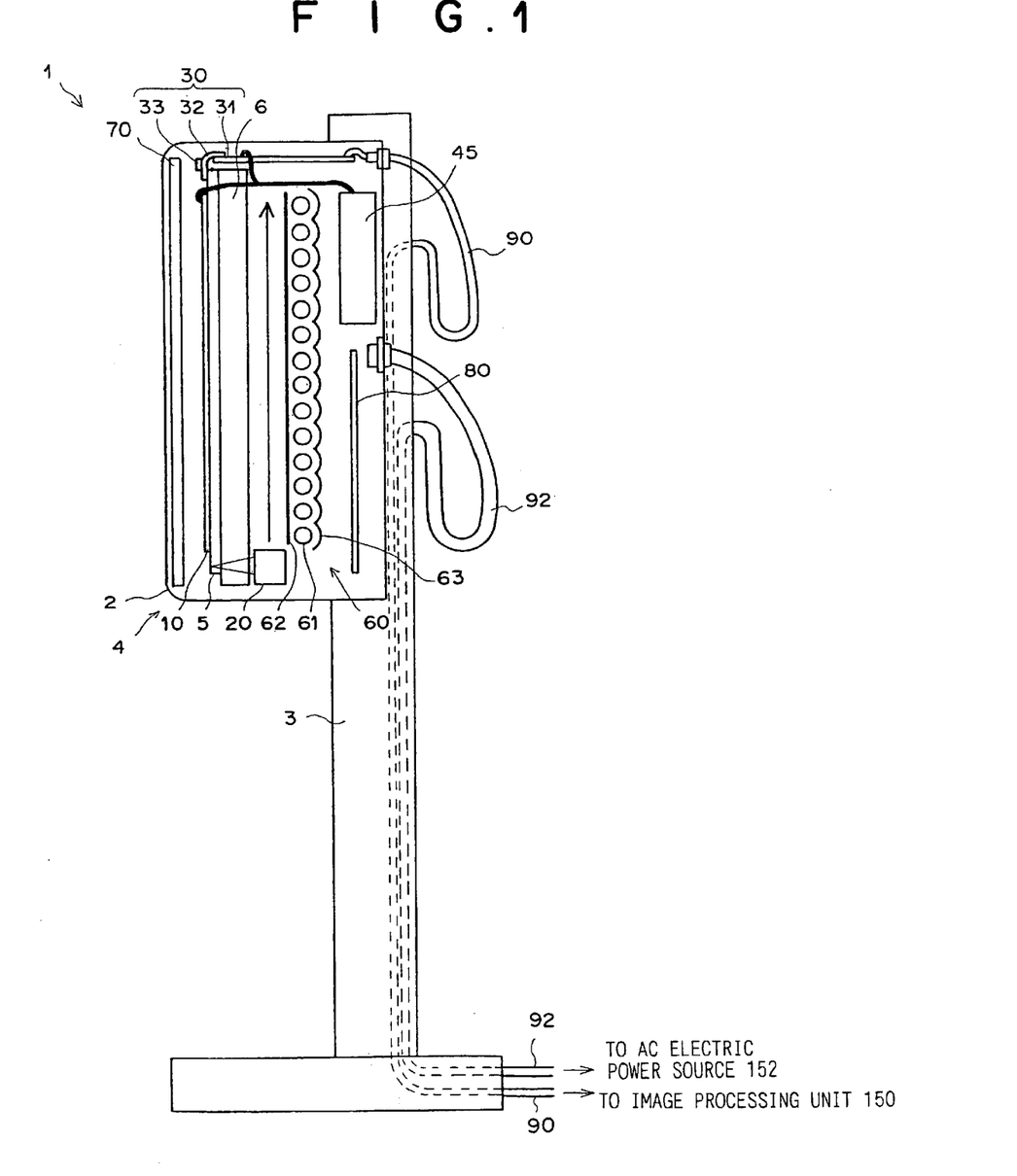
FIG. 1 is a sectional side view showing an embodiment of the imaging apparatus in accordance with the present invention, which is constituted as a chest image recording and read-out apparatus.

FIG. 1 is a sectional side view showing an embodiment of the imaging apparatus in accordance with the present invention, which is constituted as a chest image recording and read-out apparatus 1. As illustrated in FIG. 1, the chest image recording and read-out apparatus 1 comprises an imaging section 4, which is supported for vertical movement by a support post for image recording 3 via an actuator (not shown), such as a ball screw or a cylinder.

The imaging section 4 comprises a radiation image detector 10, which acts as an imaging device and is formed on a glass substrate 5, and a base plate 6 for supporting the glass substrate 5, on which the radiation image detector 10 has been formed. The imaging section 4 also comprises a reading exposure light source section 20, which is operated when radiation image information having been recorded on the radiation image detector 10 is to be read out from the radiation image detector 10. The imaging section 4 further comprises current detecting means 30 for obtaining an image signal by detecting electric currents, which flow out from the radiation image detector 10 when the radiation image detector 10 is scanned with light having been radiated out from the reading exposure light source section 20. The imaging section 4 still further comprises a high-voltage electric power source section 45 for applying a predetermined voltage across the radiation image detector 10. The imaging section 4 also comprises a pre-exposure light source section 60 for irradiating pre-exposure light to the radiation image detector 10 before an image recording operation is begun. The imaging section 4 further comprises a grid 70 for absorbing scattered rays, which have been scattered by an object (not shown) when radiation passes through the object. The grid 70 is located on one side of the radiation image detector 10, which one side stands facing the object. The imaging section 4 still further comprises a controlling printed-circuit board 80, which constitutes control means for controlling the reading exposure light source section 20, the pre-exposure light source section 60, and the grid 70. The above-enumerated elements constituting the imaging section 4 are accommodated within a case housing 2.

Also, the imaging section 4 is provided with a signal cable 90 for transmitting the image signal, which has been obtained from the current detecting means 30, through the support post for image recording 3 to an exterior image processing unit 150. The imaging section 4 is further provided with a power cable 92, which extends through the support post for image recording 3 and is connected to an exterior alternating current (a.c.) electric power source 152.

As described above, the elements for performing the image recording operation and an image read-out operation are accommodated within the single case housing 2. Therefore, the size of the imaging section 4 is capable of being kept small, and the imaging section 4 is capable of being moved easily. The features of the imaging section 4 are advantageous in practice.

The current detecting means 30 comprises a printed-circuit board 31 and a tape automated bonding (TAB) film 32, which is comparatively short and has one end connected to the printed-circuit board 31. The current detecting means 30 also comprises a charge amplifying IC 33, which is located on the TAB film 32. The other end of the TAB film 32 is connected to the radiation image detector 10.

Figure 2:
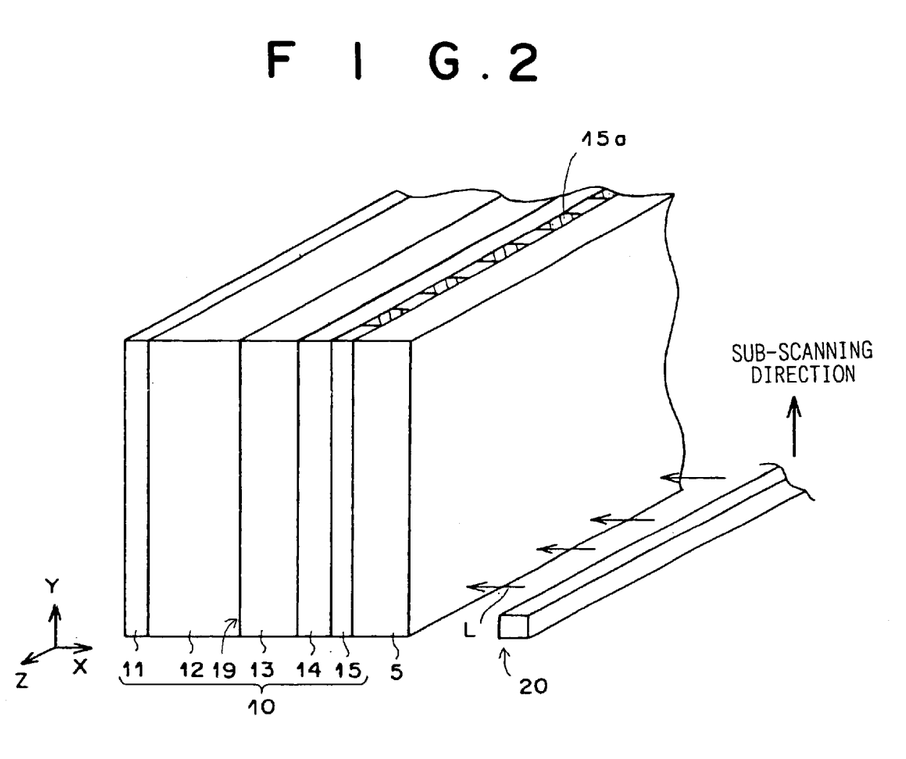
FIG. 2 is a perspective view showing an example of an image detector and a reading exposure light source section, which are utilized in the chest image recording and read-out apparatus of FIG. 1.

FIG. 2 is a perspective view showing an example of the image detector 10 and the reading exposure light source section 20. In FIG. 2, the base plate 6 is not shown.

The radiation image detector 10 records the radiation image information as an electrostatic latent image and generates electric currents in accordance with the electrostatic latent image when it is scanned with a reading electromagnetic wave (hereinbelow referred to as reading light). Specifically, as illustrated in FIG. 2, the radiation image detector 10 is formed on the glass substrate 5. The radiation image detector 10 comprises a first electrically conductive layer 11, which has permeability to recording electromagnetic wave, and the like, e.g. X-rays carrying image information of an object. The recording electromagnetic wave will hereinbelow be referred to as the recording light. The radiation image detector 10 also comprises a recording photo-conductive layer 12, which generates electric charges and exhibits photo-conductivity when it is exposed to the recording light. The radiation image detector 10 further comprises a charge transporting layer 13, which acts approximately as an insulator with respect to latent image polarity charges (e.g., negative charges) occurring in the first electrically conductive layer 11, and which acts approximately as a conductor with respect to transported polarity charges (positive charges in this example) having a polarity opposite to the polarity of the latent image polarity charges occurring in the first electrically conductive layer 11. The radiation image detector 10 still further comprises a reading photo-conductive layer 14, which generates electric charges and exhibits photo-conductivity when it is exposed to reading light, and a second electrically conductive layer 15 having permeability to the reading light. The first electrically conductive layer 11, the recording photo-conductive layer 12, the charge transporting layer 13, the reading photo-conductive layer 14, and the second electrically conductive layer 15 are overlaid in this order. A charge accumulating section 19 is formed at an interface between the recording photo-conductive layer 12 and the charge transporting layer 13.

Each of the first electrically conductive layer 11 and the second electrically conductive layer 15 constitutes an electrode. The electrode of the first electrically conductive layer 11 is formed as a flat plate-shaped electrode, which is flat in two-dimensional directions. As indicated by the hatching in FIG. 2, the electrode of the second electrically conductive layer 15 is formed as a striped electrode comprising a plurality of elements (linear electrodes) 15a, 15a, . . . , which are arrayed in a striped pattern at a pixel pitch. (As for the striped electrode, reference may be made to an electrostatic recording material described in Japanese Patent Application No. 10(1998)-232824. The array direction of the elements 15a, 15a, . . . , along which the elements 15a, 15a, . . . stand side by side, corresponds to the main scanning direction. The longitudinal direction of each element 15a corresponds to the sub-scanning direction.

The reading photo-conductive layer 14 should preferably be constituted of a photo-conductive material having a high sensitivity with respect to an electromagnetic wave having wavelengths (300 nm to 550 nm) of the near ultraviolet to blue region and having a low sensitivity with respect to an electromagnetic wave having wavelengths (at least 700 nm) of the red region. Specifically, the reading photo-conductive layer 14 should preferably contain, as a principal constituent, at least one constituent selected from the group consisting of a-Se, $PbI_2$, $Bi_{12}(Ge, Si)O_{20}$, perylene bis-imide (R=n-propyl), and perylene bis-imide (R=n-neopentyl). In this embodiment, the reading photo-conductive layer 14 is constituted of a-Se.

In this embodiment, the width of each element 15a is 50 $\mu$m. Also, the elements 15a, 15a, . . . are arrayed at a pixel pitch of 100 $\mu$m. The elements 15a, 15a, . . . are constituted of a material permeable to light having wavelengths of at most 550 nm, e.g., indium tin oxide (ITO) or thin film Al.

Figure 3A:
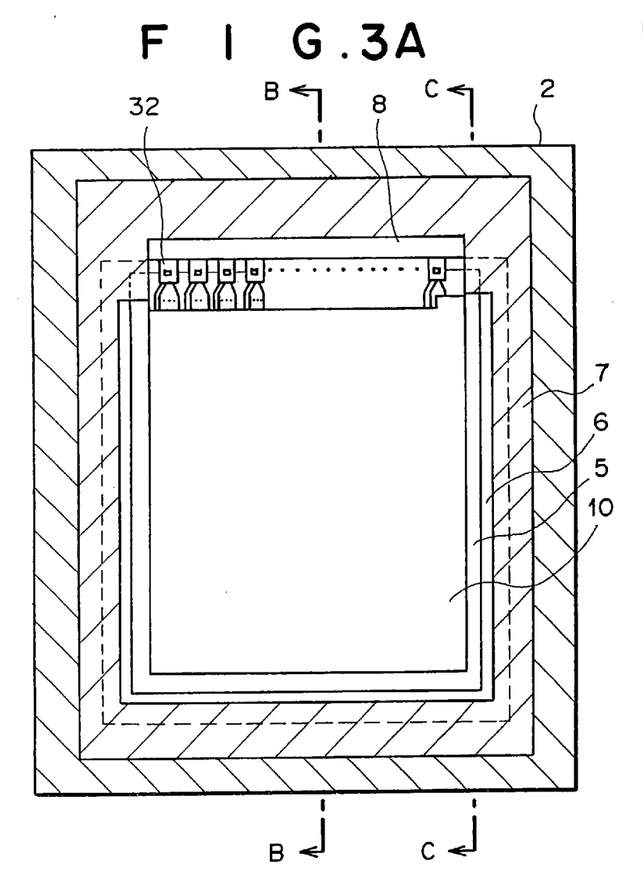
FIG. 3A is a front view showing a base plate, which supports the image detector, and a case housing, which front view is taken from the side of the image detector.
Figure 3B:
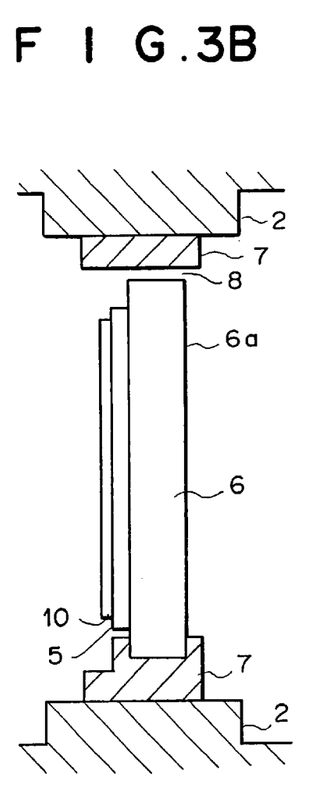
FIG. 3B is a sectional view taken on line B—B of FIG. 3A.
Figure 3C:
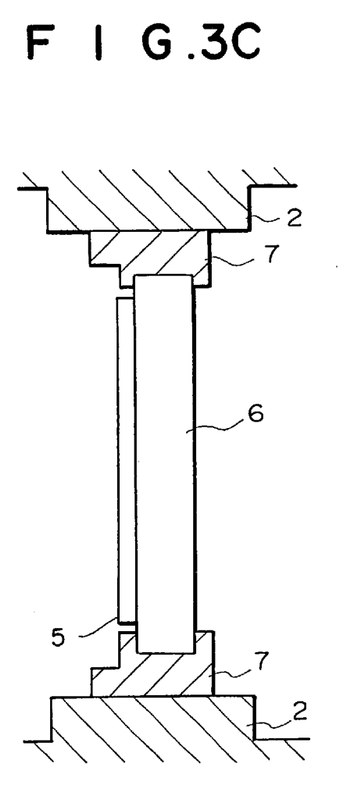
FIG. 3C is a sectional view taken on line C—C of FIG. 3A.

FIG. 3A is a front view showing the radiation image detector 10 at the imaging section 4, the glass substrate 5 for supporting the radiation image detector 10, the base plate 6, and the case housing 2, which front view is taken from the side of the image detector 10. FIG. 3B is a sectional view taken on line B—B of FIG. 3A. FIG. 3C is a sectional view taken on line C—C of FIG. 3A. As illustrated in FIGS. 3A, 3B, and 3C, the base plate 6 supports the glass substrate 5, on which the radiation image detector 10 has been formed. Ordinarily, the glass substrate 5 has a thickness of at most 1.1 mm and is thus markedly thin. The base plate 6 is constituted of a sufficiently thick glass plate, such that the base plate 6 does not bend when the base plate 6 is located vertically as illustrated in FIGS. 3A, 3B, and 3C. In this embodiment, the base plate 6 has a thickness of at least 5 mm. The base plate 6 has permeability with respect light radiated out from a reading exposure light source and light radiated out from a pre-exposure light source. Also, the base plate 6 has a refractive index and a coefficient of thermal expansion, which are approximately identical with the refractive index and the coefficient of thermal expansion of the glass substrate 5. Further, in order for light loss and stray light due to reflection of the reading light to be prevented from occurring, an anti-reflection (AR) coating film is formed on a reading light entry face 6a of the base plate 6. The base plate 6 and the glass substrate 5 are adhered to each other with an adhesive agent, such as an epoxy resin or Canada balsam. As illustrated in FIGS. 3A, 3B, and 3C, four corner regions, right and left side regions, and a bottom region of the base plate 6 are fitted into a fitting member 7 constituted of a metal, or the like, and the base plate 6 is thus reinforced and secured to the case housing 2. A space 8, through which the TAB film 32 for connecting the radiation image detector 10 and the printed-circuit board 31 to each other passes, is formed between the top region of the base plate 6 and the fitting member 7. Specifically, as illustrated in FIG. 3B, the space 8 is formed between the top region of the base plate 6, which top region extends above the radiation image detector 10, and the fitting member 7. Also, as illustrated in FIG. 3C, the upper right corner region of the base plate 6 shown in FIG. 3A is fitted into the fitting member 7.

The reading exposure light source section 20 comprises a light source, which is constituted of a plurality of LED chips arrayed in a line, and an optical system for linearly irradiating the light, which has been radiated out from the light source, to the radiation image detector 10. The reading exposure light source section 20 is kept at a predetermined distance from the radiation image detector 10 and is moved by a linear motor (not shown) in the longitudinal direction of each element 15a of the second electrically conductive layer 15 of the radiation image detector 10. In this manner, the entire area of the radiation image detector 10 is exposed to the light having been radiated out from the light source.

As described above, the reading photo-conductive layer 14 is constituted of the photo-conductive material having a high sensitivity with respect to the electromagnetic wave having wavelengths (300 nm to 550 nm) of the near ultraviolet to blue region and having a low sensitivity with respect to the electromagnetic wave having wavelengths (at least 700 nm) of the red region. Therefore, as the light source of the reading exposure light source section 20, a light source, which produces light having wavelengths (at most 550 nm) of the near ultraviolet to blue region, is employed.

Figure 4A:
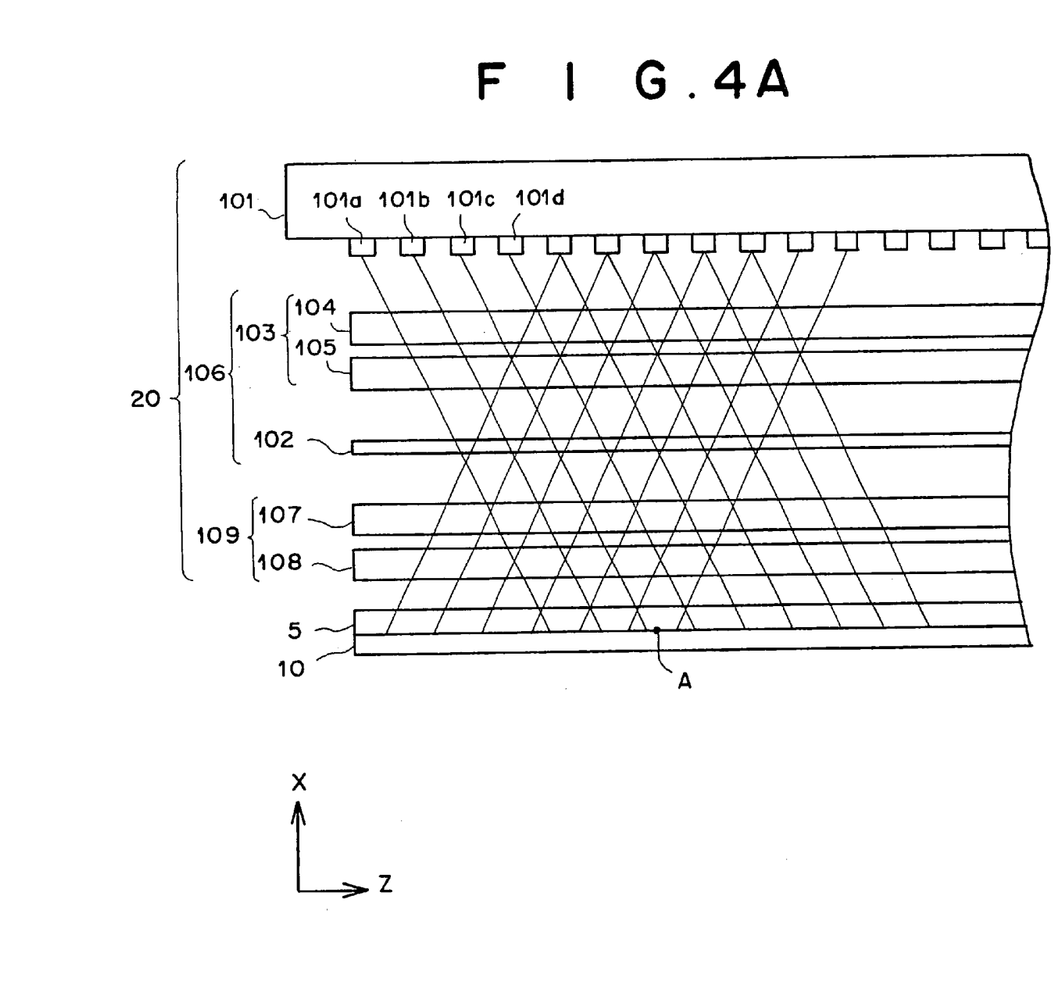
FIG. 4A is a side view showing an example of the reading exposure light source section of FIG. 2, which side view is taken from a Y direction.
Figure 4B:
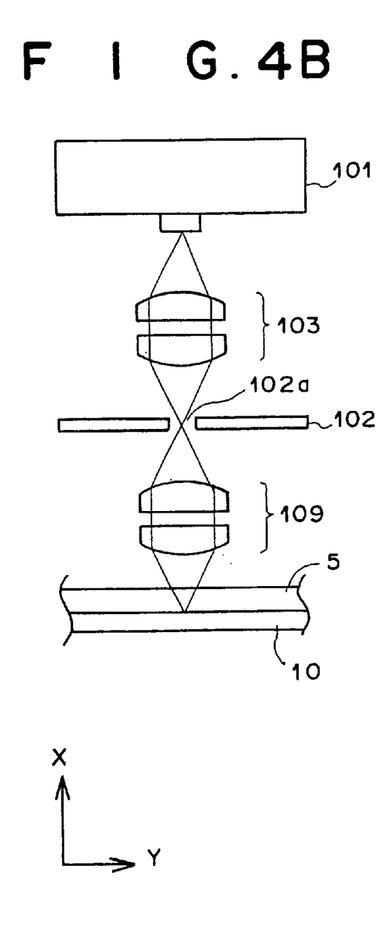
FIG. 4B is an X-Y sectional view showing the example of the reading exposure light source section of FIG. 4A.

An example of the reading exposure light source section 20 will be described hereinbelow with reference to FIGS. 4A and 4B. FIG. 4A is a side view showing the example of the reading exposure light source section 20 of FIG. 2, which side view is taken from a Y direction. FIG. 4B is an X-Y sectional view showing the example of the reading exposure light source section 20 of FIG. 4A. In FIGS. 4A and 4B, the base plate 6 is not shown.

As illustrated in FIGS. 4A and 4B, the reading exposure light source section 20 comprises a light source 101, which comprises a plurality of LED chips 101a, 101b, . . . arrayed linearly in a Z axis direction. The reading exposure light source section 20 also comprises first optical means 106 for enhancing the quality of the light having been radiated out from the light source 101. The first optical means 106 is provided with a slit member 102, which has an opening area 102a extending in the longitudinal direction of the light source 101, and cylindrical lenses 104 and 105, which constitute an optical member 103 for converging the light toward the opening area 102a of the slit member 102. The reading exposure light source section 20 further comprises second optical means 109. The second optical means 109 is provided with cylindrical lenses 107 and 108 for converging the light, which has passed through the first optical means 106, onto the surface of the radiation image detector 10 and with respect to the direction normal to the longitudinal direction of the light source 101.

The slit member 102 performs spatial filtering of the light, which has been radiated out from the light source 101, in order to restrict flare light and determines the beam width on the radiation image detector 10. It is sufficient for the slit member to restrict the spatial spread of the light. The slit member is not limited to the mechanical slit member 102 having the opening area 102a and may be a slit member having an optical space, such as a distributed density filter.

Each of light beams, which have been radiated out from the light emission points, i.e. the LED chips 101a, 101b, . . . of the light source 101, is converged by the cylindrical lenses 104 and 105 toward the opening area 102a of the slit member 102 and into a light beam extending along the longitudinal direction of the opening area 102a and is thus subjected to filtering. Each of the light beams is then converged by the cylindrical lenses 107 and 108 of the second optical means 109 and with respect to the direction normal to the longitudinal direction of the light source 101. Each of the thus converged light beams is irradiated onto the radiation image detector 10. Each of the light beams, which have been radiated out from the LED chips 101a, 101b, . . . spreads and diffuses uniformly in all directions and is not converged with respect to the longitudinal direction of the light source 101. Therefore, on the radiation image detector 10, each of the light beams, which have been radiated out from the LED chips 101a, 101b, . . . , spreads in the longitudinal direction of the light source 101. As a result, the light having been radiated out from the light source 101 is linearly irradiated to the radiation image detector 10, and a plurality of pixels arrayed linearly on the radiation image detector 10 are simultaneously exposed to each of the light beams having been radiated out from the LED chips 101a, 101b, . . . . Specifically, the light beams, which have been radiated out from several LED chips among the LED chips 101a, 101b, . . . , are simultaneously irradiated to an identical pixel on the radiation image detector 10. For example, as illustrated in FIG. 4A, the light beams, which have been radiated out from seven LED chips among the LED chips 101a, 101b, . . . , are simultaneously irradiated to an identical point A on the radiation image detector 10.

More specifically, for example, the focal length of the optical system may be 40 mm, and the pixel size may be 100 $\mu$m. Also, the intervals between the LED chips (i.e., the intervals between the light emission points) may be 200 $\mu$m, and the beam spread angle, which is taken from each LED chip and in the longitudinal direction of the light source, may be 120° (half value). In such cases, the light beams, which have been radiated out from at least 700 LED chips, are simultaneously irradiated to an identical pixel on the radiation image detector 10.

At the reading exposure light source section 20 described above, in lieu of the cylindrical lenses 104 and 105 of the first optical means 106, a SELFOC lens may be employed.

Also, the light source 101 of the reading exposure light source section 20 described above comprises the plurality of the arrayed LED chips 101a, 101b, . . . . Alternatively, in lieu of the LED chips 101a, 101b, . . . , a plurality of LD chips may be arrayed. As another alternative, an LED array or an LD array comprising a plurality of light emission points arrayed linearly may be employed as the light source.

In the embodiment described above, the reading exposure light source section 20 is provided with the light source 101 having the plurality of the light emission points arrayed linearly. However, the reading exposure light source section in the imaging apparatus in accordance with the present invention is not limited to the reading exposure light source section 20 described above. For example, a reading exposure light source section comprising a surface-shaped light source, which is provided with small light sources arrayed in a surface-like form, and light source control means for controlling the surface-shaped light source may be employed in lieu of the reading exposure light source section 20. The reading exposure light source section constituted in this manner is described in, for example, Japanese Patent Application No. 11(1999)-242876.

Figure 5A:
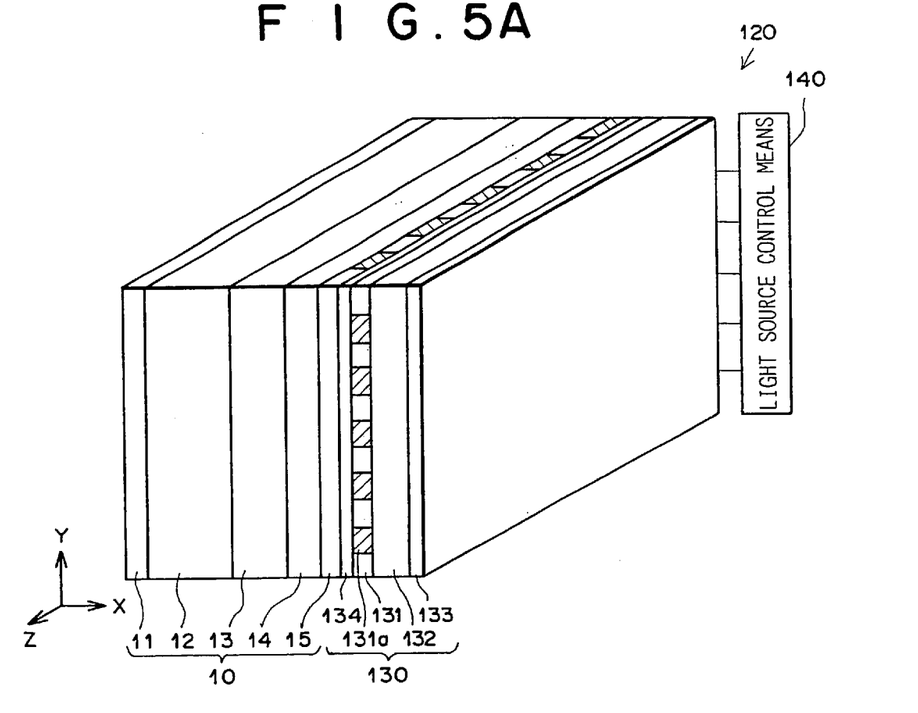
FIG. 5A is a perspective view showing the image detector and a different example of a reading exposure light source section.
Figure 5B:
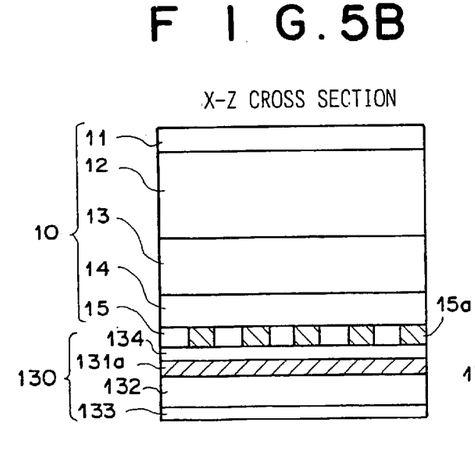
FIG. 5B is an X-Z sectional view showing the image detector and the different example of the reading exposure light source section of FIG. 5A.
Figure 5C:
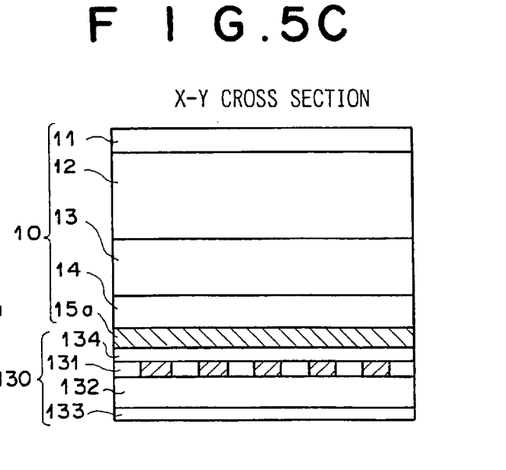
FIG. 5C is an X-Y sectional view showing the image detector and the different example of the reading exposure light source section of FIG. 5A.

FIG. 5A is a perspective view showing the image detector 10 and a different example of a reading exposure light source section 120. FIG. 5B is an X-Z sectional view showing the image detector 10 and the different example of the reading exposure light source section 120 of FIG. 5A. FIG. 5C is an X-Y sectional view showing the image detector 10 and the different example of the reading exposure light source section 120 of FIG. 5A. As illustrated in FIGS. 5A, 5B, and 5C, the different example of the reading exposure light source section 120 comprises a surface-shaped light source 130, which is located on the side of the second electrically conductive layer 15 of the radiation image detector 10 and is combined with the radiation image detector 10 into an integral body. The reading exposure light source section 120 also comprises light source control means 140 for controlling the surface-shaped light source 130.

Specifically, the surface-shaped light source 130 is constituted of an electroluminescence (EL) device. The surface-shaped light source 130 comprises an electrically conductive layer 131, an EL layer 132, and an electrically conductive layer 133. An insulation layer 134 is formed between the second electrically conductive layer 15 of the radiation image detector 10 and the electrically conductive layer 131 of the surface-shaped light source 130. The electrically conductive layer 131 is formed as a striped electrode, which comprises a plurality of elements (linear electrodes) 131a, 131a, . . . arrayed at the pixel pitch and in a stripe-like form so as to intersect (in this embodiment, approximately perpendicularly) with the elements 15a, 15a, . . . of the radiation image detector 10. In this manner, the surface-shaped light source 130 is constituted such that the plurality of the elements 131a, 131a, . . . (hatched in FIG. 5A), which act as line-shaped light sources, are arrayed in a surface form. Each of the elements 131a, 131a, . . . is connected to the light source control means 140. Also, each of the elements 131a, 131a, . . . is formed from a material permeable to EL light produced by the EL layer 132. The electrically conductive layer 133 is formed as a flat plate-shaped electrode. The electrically conductive layer 133 is formed from a material, which totally reflects the EL light produced by the EL layer 132.

The light source control means 140 applies a predetermined voltage across the elements 131a, 131a, . . . and the electrically conductive layer 133, which stands facing the elements 131a, 131a, . . . . The voltage is applied successively to the elements 131a, 131a, . . . . Alternatively, the voltage may be applied simultaneously to several elements 131a, 131a, . . . or all of them. The elements 131a, 131a, . . . are successively changed over, and a predetermined d.c. voltage is applied across each element 131a and the electrically conductive layer 133. By the application of the d.c. voltage, the EL light is produced by the EL layer 132, which is sandwiched between the element 131a and the electrically conductive layer 133. Since the element 131a has the line-like shape, the EL light having passed through the element 131a is capable of being utilized as the line-like reading light. Specifically, the surface-shaped light source 130 is equivalent to a light source comprising a plurality of line-shaped small light sources, which are arrayed in a surface form. In cases where the EL light is produced by successively changing over the elements 131a, 131a, . . . , the radiation image detector 10 is electrically scanned with the reading light.

In cases where the surface-shaped light source 130, which has been combined with the radiation image detector 10 into an integral body, is utilized as the reading exposure light source, a space for the movement of the light source and a linear motor, or the like, for moving the light source need not be utilized. Therefore, the size of the entire imaging apparatus is capable of being kept small.

Also, the reading exposure light source section 120, which comprises the surface-shaped light source 130 and the light source control means 140, is capable of being utilized also as a pre-exposure light source section. Specifically, a predetermined voltage is applied simultaneously across a plurality of the elements 131a, 131a, . . . and the electrically conductive layer 133. In such cases, it is sufficient for the pre-exposure light, which is produced by the EL layer 132 with the application of the voltage, to be approximately uniformly irradiated to the radiation image detector 10, and no limitation is imposed upon the number of the elements 131a, 131a, . . . , to which the voltage is applied. For example, the voltage may be applied only to several elements, which are selected at predetermined intervals from the plurality of the elements 131a, 131a, . . . . Alternatively, the voltage may be applied to all of the elements 131a, 131a, . . . .

In cases where the reading light and the pre-exposure light are produced by the single same light source, since a particular pre-exposure light source need not be utilized, the size of the imaging apparatus is capable of being reduced even further. Also, since the number of parts of the imaging apparatus is capable of being kept small, the cost of the imaging apparatus is capable of being kept low.

In cases where the surface-shaped light source 130, which has been combined with the radiation image detector 10 into an integral body, is utilized as the reading exposure light source and the pre-exposure light source, the side of the surface-shaped light source 130 in the combination of the radiation image detector 10 and the surface-shaped light source 130 may be supported on the base plate. In such cases, the base plate need not have permeability to light.

Figure 6:
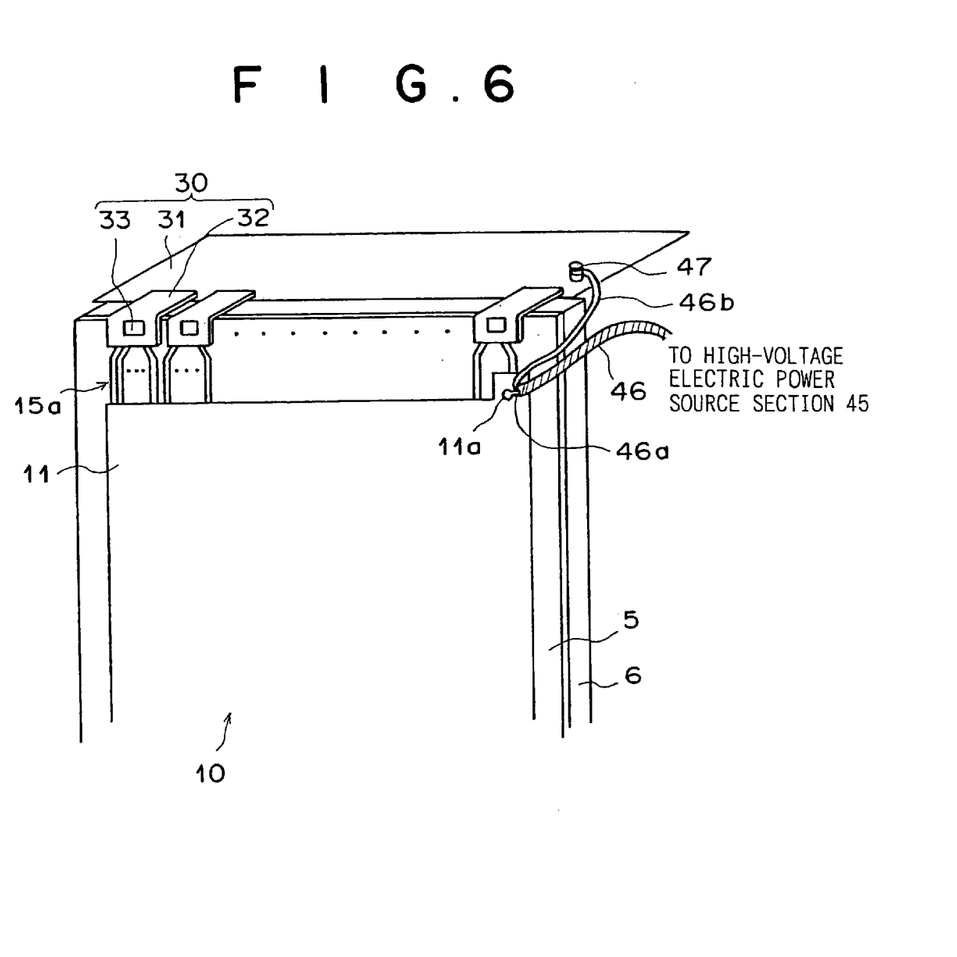
FIG. 6 is a perspective view showing how the image detector, current detecting means, and a high-voltage electric power source section are connected to one another.

FIG. 6 is a perspective view showing how the image detector 10, the current detecting means 30, and the high-voltage electric power source section 45 are connected to one another. As illustrated in FIG. 6, each of the elements 15a, 15a, . . . of the radiation image detector 10 is connected to the charge amplifying IC 33 via a printed-circuit pattern (not shown), which is formed on the TAB film 32. Also, the charge amplifying IC 33 is connected to the printed-circuit board 31 via a printed-circuit pattern (not shown), which is formed on the TAB film 32. In this embodiment, instead of all elements 15a, 15a, . . . being connected to a single charge amplifying IC 33, several charge amplifying IC's 33, 33, . . . to several tens of charge amplifying IC's 33, 33, . . . are utilized as a whole, and several adjacent elements 15a, 15a, . . . are connected to one of the charge amplifying IC's 33, 33, . . . .

The first electrically conductive layer 11, which is constituted as the flat plate-shaped electrode of the radiation image detector 10, is provided with a non-imaging region 11a, which extends from the image recording region. A hot side (a core wire) 46a of a cable 46, which extends from the high-voltage electric power source section 45 located in the vicinity of the radiation image detector 10, is directly bonded to the non-imaging region 11a. A grounding side (a cladding layer) 46b of the cable 46 is connected by a screw 47 to the printed-circuit board 31. In this embodiment, the hot side 46a is set at a minus potential with respect to the grounding side 46b. The grounding side 46b connected to the printed-circuit board 31 is connected to each charge amplifying IC 33 via the TAB film 32 and thus acts as a reference potential of the charge amplifying IC 33.

As described above, in the chest image recording and read-out apparatus 1, the high-voltage electric power source section 45 is located in the vicinity of the radiation image detector 10 and the printed-circuit board 31. Therefore, the length of the cable 46 for the connection of the electric power source is capable of being kept short. Also, a special cable need not be utilized as the cable 46. Accordingly, processing of the cable 46 becomes easy. Further, the hot side 46a of the cable 46 is connected directly by the bonding to the radiation image detector 10, and the grounding side 46b of the cable 46 is connected directly by the screw 47 to printed-circuit board 31. As a result, a special connector need not be utilized, and the cost of the chest image recording and read-out apparatus 1 is capable of being kept low.

In this embodiment, the TAB connection is utilized for the connection of the radiation image detector 10 and the printed-circuit board 31 to each other. Alternatively, the radiation image detector 10 and the printed-circuit board 31 may be connected to each other by utilizing wire bonding or anisotropic electrically conductive rubber.

Figure 7:
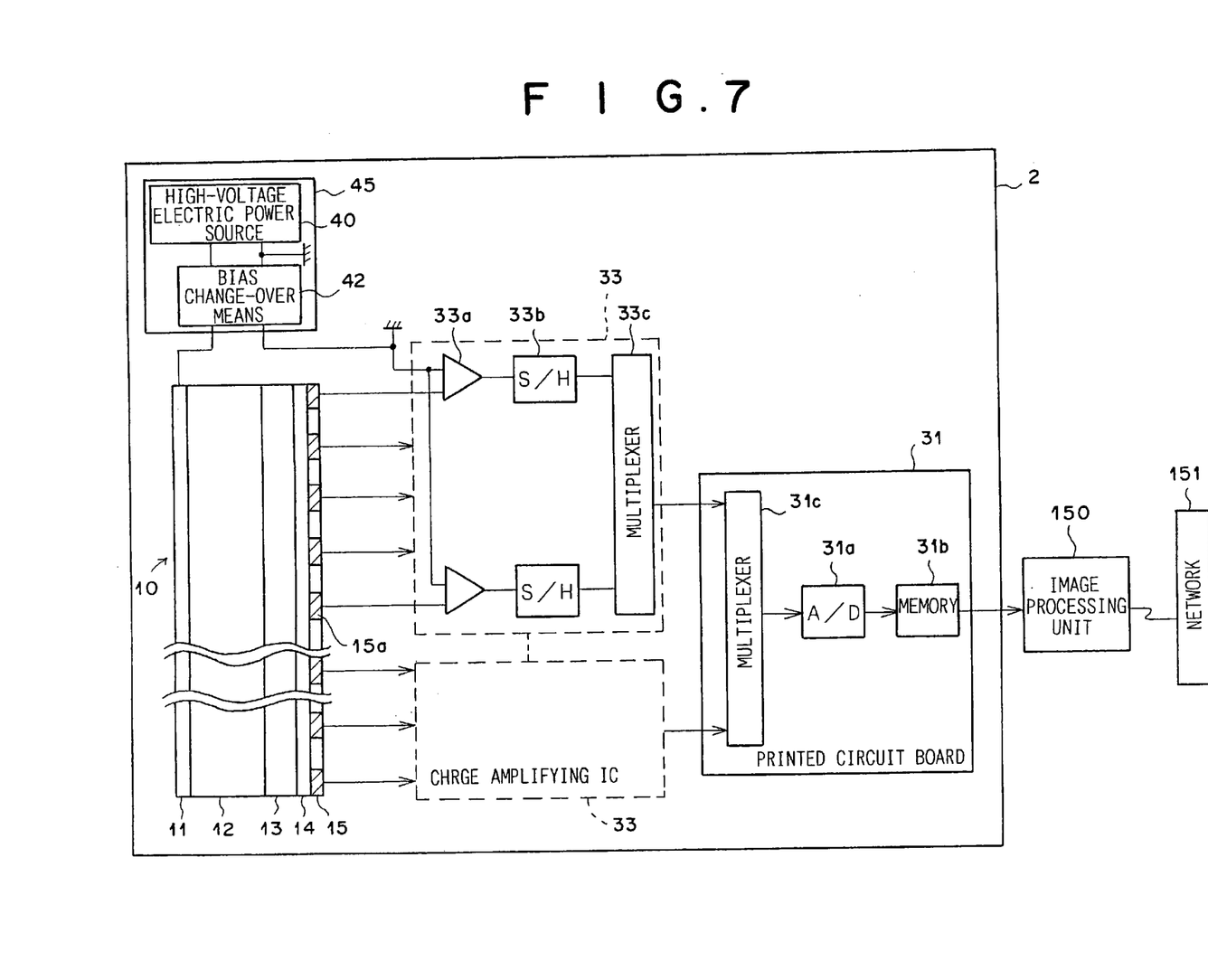
FIG. 7 is a block diagram showing how the current detecting means and the high-voltage electric power source section are connected to the image detector.

FIG. 7 is a block diagram showing how the current detecting means 30 and the high-voltage electric power source section 45, which are located within the case housing 2, are connected to the image detector 10.

As illustrated in FIG. 7, the high-voltage electric power source section 45 is constituted of a circuit, which comprises a high-voltage electric power source 40 and bias change-over means 42. The high-voltage electric power source 40 is connected to the radiation image detector 10 via the bias change-over means 42 for changing over between bias application to the radiation image detector 10 and short-circuiting. The circuit constituting the high-voltage electric power source section 45 is designed for prevention of charging and discharging excessive electric current, such that a peak value of the electric current flowing at the time of change-over may be limited and a portion of the apparatus, at which the electric current concentrates, may be prevented from being broken.

The charge amplifying IC 33 formed on the TAB film 32 comprises a plurality of charge amplifiers 33a, 33a, . . . , each of which is connected to one element 15a of the radiation image detector 10. The charge amplifying IC 33 also comprises a plurality of sampling and holding circuits (S/H) 33b, 33b, . . . , each of which is connected to one charge amplifier 33a. The charge amplifying IC 33 further comprises a multiplexer 33c for multiplexing signals obtained from the sampling and holding circuits 33b, 33b, . . . . Each of the electric currents flowing out from the radiation image detector 10 is converted by each charge amplifier 33a into a voltage. The voltage is sampled and held by the corresponding sampling and holding circuit 33b at predetermined timings. The voltages, which have been sampled and held and which correspond to the respective elements 15a, 15a, . . . are successively fed out from the multiplexer 33c, such that the voltages are changed over in the array order of the elements 15a, ID 15a, . . . . (The successive feeding-out of the voltages from the multiplexer 33c corresponds to part of the main scanning operation.) The signals, which have been successively fed out from the multiplexer 33c, are fed into a multiplexer 31c, which has been formed on the printed-circuit board 31. Also, the voltages, which correspond to the respective elements 15a, 15a, . . . , are successively fed out from the multiplexer 31c, such that the voltages are changed over in the array order of the elements 15a, 15a, . . . . The main scanning operation is finished with this step. The signals, which have been successively fed out from the multiplexer 31c, are converted by an analog-to-digital converter (A/D) 31a into a digital signal. The thus obtained digital signal is stored in a memory 31b.

As the pre-exposure light source of the pre-exposure light source section 60, it is necessary to utilize a light source having characteristics such that the pre-exposure light is emitted and quenched quickly and exhibits little afterglow. In this embodiment, an external electrode type of rare gas fluorescent lamp is utilized as the pre-exposure light source. Specifically, as illustrated in FIG. 1, the pre-exposure light source section 60 comprises a plurality of external electrode types of rare gas fluorescent lamps 61, 61, . . . , which extend in a direction normal to the plane of the sheet of FIG. 1. The pre-exposure light source section 60 also comprises a wavelength selecting filter 62, which is located between the rare gas fluorescent lamps 61, 61, . . . and the radiation image detector 10. The pre-exposure light source section 60 further comprises a reflecting plate 63 located on the side of the rare gas fluorescent lamps 61, 61, . . . , which side is opposite to the wavelength selecting filter 62. The reflecting plate 63 efficiently reflects the light, which has been radiated out from the rare gas fluorescent lamps 61, 61, . . . , toward the radiation image detector 10. It is sufficient for the pre-exposure light to be irradiated to the entire second electrically conductive layer 15 of the radiation image detector 10, and particular light converging means need not be provided. However, the pre-exposure light should preferably have a narrow illuminance distribution. As the pre-exposure light source, in lieu of the rare gas fluorescent lamps 61, 61, . . . , for example, a surface-shaped light source comprising a plurality of LED chips arrayed in a surface form may be utilized. Also, in cases where the base plate 6 is imparted with the wavelength selecting properties, the wavelength selecting filter 62 may be omitted.

When the electrostatic latent image is to be read out from the radiation image detector 10, basically, the latent image charges having been accumulated in the radiation image detector 10 are capable of being readout perfectly. However, it will often occur that the radiation image detector 10 cannot be read out perfectly, and residual charges remain in the radiation image detector 10. Also, when the electrostatic latent image is to be recorded on the radiation image detector 10, a high voltage is applied across the radiation image detector 10 before the recording light is irradiated to the radiation image detector 10. When the high voltage is applied across the radiation image detector 10, dark current occurs, and electric charges (dark current charges) due to the dark current are accumulated in the radiation image detector 10. Further, it has been known that various kinds of electric charges other than the residual charges and the dark current charges are also accumulated in the radiation image detector 10 before the recording light is irradiated to the radiation image detector 10. The unnecessary charges, such as the residual charges and the dark current charges, which are accumulated in the radiation image detector 10 before the recording light is irradiated to the radiation image detector 10, are added to the electric charges, which are accumulated in the radiation image detector 10 when the recording light is irradiated to the radiation image detector 10 and which carry image information. As a result, when the electrostatic latent image is read out from the radiation image detector 10, besides the signal components in accordance with the electric charges carrying the image information, signal components due to the unnecessary charges are contained in the signals, which are obtained from the radiation image detector 10. In such cases, the problems with regard to a residual image phenomenon and decrease of the signal-to-noise ratio occur.

The pre-exposure operation is performed in order to erase the unnecessary charges, which are accumulated in the radiation image detector 10 before the recording light is irradiated to the radiation image detector 10, and to eliminate the problems with regard to a residual image phenomenon and decrease of the signal-to-noise ratio.

How the chest image recording and read-out apparatus 1 operates will be described hereinbelow.

Firstly, the imaging section 4 is moved vertically and located at a height appropriate for the size of the object (a patient).

Thereafter, the pre-exposure light is irradiated to the radiation image detector 10, and the unnecessary charges having been accumulated in the radiation image detector 10 are erased.

The pre-exposure operation may be performed before the voltage is applied across the radiation image detector 10. Alternatively, the pre-exposure operation may be performed after the voltage has been applied across the radiation image detector 10. Also, the pre-exposure light source may be turned on before the voltage is applied across the radiation image detector 10, and may be turned off after the voltage has been applied across the radiation image detector 10.

When the electrostatic latent image is to be recorded on the radiation image detector 10, firstly, a negative pole of the high-voltage electric power source 40 is connected by the bias change-over means 42 to the first electrically conductive layer 11, and the d.c. voltage is applied across the first electrically conductive layer 11 and the elements 15a, 15a, . . . . In this manner, the first electrically conductive layer 11 and the second electrically conductive layer 15 are electrically charged. As a result, a U-shaped electric field having the concavity of the U-shape at the element 15a is formed between the first electrically conductive layer 11 and the element 15a in the radiation image detector 10.

Thereafter, the operator pushes an irradiation push button (not shown) with an appropriate timing. As a result, the grid 70 located on the side of the imaging section 4, which side stands facing the object, begins swinging. X-rays are irradiated to the radiation image detector 10 at the time at which the swinging speed of the grid 70 reaches a predetermined speed and a sufficient voltage has been applied across the radiation image detector 10 with the voltage application described above.

In the manner described above, the X-rays having passed through the object, i.e. the recording light carrying the radiation image information of the object, is irradiated to the radiation image detector 10. As a result, pairs of positive and negative charges occur in the recording photo-conductive layer 12 of the radiation image detector 10. Of the pairs of positive and negative charges, the negative charges are centralized upon the elements 15a, 15a, . . . along the electric field distribution described above. In this manner, the negative charges are accumulated at the charge accumulating section 19, which is formed at the interface between the recording photo-conductive layer 12 and the charge transporting layer 13. The amount of the accumulated negative charges, i.e. the latent image polarity charges, is approximately in proportion to the dose of the radiation carrying the radiation image information. Therefore, the latent image polarity charges carry the electrostatic latent image. In this manner, the electrostatic latent image is recorded on the radiation image detector 10. The positive charges occurring in the recording photo-conductive layer 12 are attracted to the first electrically conductive layer 11, combine with negative charges injected from the high-voltage electric power source 40, and disappear.

After the X-rays are irradiated to the radiation image detector 10 and the electrostatic latent image has been recorded on the radiation image detector 10, the electrostatic latent image is read out from the radiation image detector 10. When the electrostatic latent image is to be read out from the radiation image detector 10, the first electrically conductive layer 11 and the second electrically conductive layer 15 of the radiation image detector 10 are short-circuited by the bias change-over means 42.

Also, the reading exposure light source section 20 is operated, and the reading light is radiated out from the light source 101. Also, the reading exposure light source section 20 is moved by the linear motor (not shown) and in the longitudinal direction of each element 15a, i.e. in the sub-scanning direction. In this manner, the entire area of the radiation image detector 10 is scanned with the reading light. As described above with respect to the reading exposure light source section 20, the line-like reading light, which has been radiated out from the reading exposure light source section 20, passes through the base plate 6 and the glass substrate 5 and is irradiated to each of the elements 15a, 15a, . . . of the radiation image detector 10.

As a result, pairs of positive and negative charges occur in the reading photo-conductive layer 14. Of the pairs of positive and negative charges, the positive charges move quickly through the charge transporting layer 13 so as to be attracted by the negative charges (the latent image polarity charges), which have been accumulated at the charge accumulating section 19. The positive charges combine with the latent image polarity charges at the charge accumulating section 19 and disappear. The negative charges occurring in the reading photo-conductive layer 14 combine with positive charges, which are injected into the second electrically conductive layer 15, and disappear. In this manner, the negative charges having been accumulated in the radiation image detector 10 disappear through the charge re-combination, and electric currents due to the movement of the electric charges at the time of the charge re-combination occur in the radiation image detector 10.

The electric currents are detected for the respective elements 15a, 15a, . . . in a parallel manner (simultaneously) by the charge amplifiers 33a, 33a, . . . for current detection, each of which is connected to one of the elements 15a, 15a, . . . . Each of the signals, which have been detected by the charge amplifiers 33a, 33a, . . . , is sampled and held by the corresponding sampling and holding circuit 33b. The voltages, which have thus been sampled and held and which correspond to the respective elements 15a, 15a, . . . , are successively fed out from the multiplexer 33c, such that the voltages are changed over in the array order of the elements 15a, 15a, . . . . The signals, which have been successively fed out from the multiplexer 33c, are fed into the multiplexer 31c, which has been formed on the printed-circuit board 31. Also, the voltages, which correspond to the respective elements 15a, 15a, . . . , are successively fed out from the multiplexer 31c, such that the voltages are changed over in the array order of the elements 15a, 15a, . . . . The signals, which have been successively fed out from the multiplexer 31c, are converted by the analog-to-digital converter 31a into the digital signal. The thus obtained digital signal is stored in the memory 31b.

The electric currents, which flow through the radiation image detector 10 when the radiation image detector 10 is scanned with the reading light, occur in accordance with the latent image charges, i.e. the electrostatic latent image. Therefore, the image signal obtained by detecting the electric currents represents the electrostatic latent image. In this manner, the electrostatic latent image is capable of being read out.

The image signal, which has been stored in the memory 31b, is fed via the signal cable 90 into the external image processing unit 150. In the image processing unit 150, the image signal is subjected to appropriate image processing. The image signal, which has been obtained from the image processing, is up-loaded to a network 151 and fed into a server or a printer together with corresponding information, which gives specifics about the image recording operation.

Figure 8:
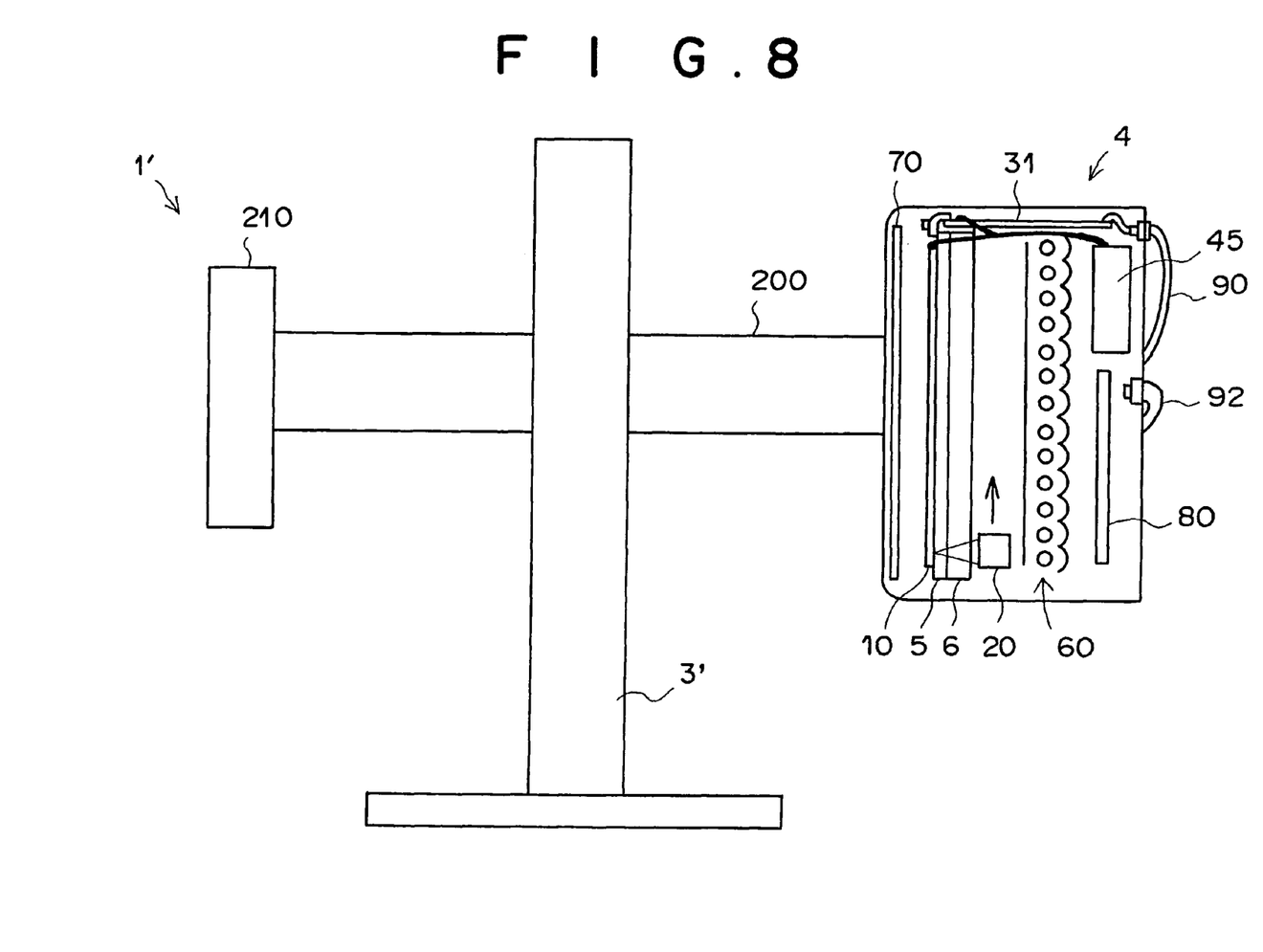
FIG. 8 is a side view showing a different embodiment of the imaging apparatus in accordance with the present invention, which is constituted as an X-ray image recording and read-out apparatus provided with a U-arm.

In the embodiment described above, the imaging apparatus in accordance with the present invention is constituted as the chest image recording and read-out apparatus 1. However, the imaging apparatus in accordance with the present invention is not limited to the chest image recording and read-out apparatus 1. For example, as illustrated in FIG. 8, the imaging apparatus in accordance with the present invention is constituted as an X-ray image recording and read-out apparatus 1'. The X-ray image recording and read-out apparatus 1' comprises a support post for image recording 3'. The X-ray image recording and read-out apparatus 1' also comprises a U-arm 200 acting as a moving section, which is supported by the support post for image recording 3' such that it is capable of being moved vertically, rotated, and tilted in oblique directions. The X-ray image recording and read-out apparatus 1' further comprises the imaging section 4 and an irradiating section 210, which are supported by the U-arm 200.

The imaging section 4 and the irradiating section 210, which are supported by the U-arm 200, are located so as to stand facing each other. The U-arm 200 is subjected to vertical movement, rotation, and the like, in accordance with a portion of the object, the image of which is to be recorded, an image recording angle, and the like. In this manner, the position of the imaging section 4 is adjusted, and the image recording operation is performed. The imaging section 4 of the X-ray image recording and read-out apparatus 1' is identical with the imaging section 4 of the chest image recording and read-out apparatus 1 described above. Also, the image recording operation is performed in the same manner as that in the imaging section 4 of the chest image recording and read-out apparatus 1 described above.

As another alternative, the imaging apparatus in accordance with the present invention may be constituted as an imaging section of an X-ray image recording and read-out apparatus, which is provided with a C-arm, basically in the same manner as that in the X-ray image recording and read-out apparatus 1' provided with the U-arm 200.

In the embodiments described above, the electrostatic recording material described in Japanese Patent Application No. 10(1998)-232824 is utilized as the radiation image detector 10. However, in the imaging apparatus in accordance with the present invention, the image detector is not limited to the electrostatic recording material described above. Specifically, the imaging apparatus in accordance with the present invention may be provided with one of various kinds of image detectors, which generate electric currents in accordance with the latent image charges carrying image information when it is scanned with a reading electromagnetic wave.

What is claimed is:

1. An imaging apparatus, comprising:
   i) a planar image detector, which records image information as an electrostatic latent image, and which generates electric currents in accordance with the electrostatic latent image when the planar image detector is scanned with a reading electromagnetic wave,
   ii) a pre-exposure light source section, which is located at a position facing the planar image detector, and which irradiates a predetermined amount of an electromagnetic wave to an entire area of the planar image detector before the electrostatic latent image is recorded on the planar image detector,
   iii) a reading exposure light source section, which is located between the planar image detector and the pre-exposure light source section, and which produces the reading electromagnetic wave and scans the planar image detector with the reading electromagnetic wave, and
   iv) current detecting means for detecting the currents flowing out of the planar image detector in accordance with the electrostatic latent image, which has been recorded on the planar image detector, when the planar image detector is scanned with the reading electromagnetic wave,
   the planar image detector, the pre-exposure light source section, the reading exposure light source section, and the current detecting means being accommodated within a single same case housing.

2. An apparatus as defined in claim 1 wherein the pre-exposure light source section comprises:
   a) a pre-exposure light source for producing the electromagnetic wave,
   b) a reflecting plate located on one side of the pre-exposure light source, which one side is opposite to the side facing the image detector, the reflecting plate reflecting the electromagnetic wave toward the image detector, and
   c) a surface-shaped filter, which is located between the pre-exposure light source and the reading exposure light source section and which transmits the electromagnetic wave having predetermined wavelengths.

3. An apparatus as defined in claim 1 or 2 wherein the reading exposure light source section comprises:
   a) a reading exposure light source, which is provided with a plurality of light emission points arrayed linearly, and
   b) first optical means, which comprises a slit member having an opening area and an optical member for converging the reading electromagnetic wave to the opening area of the slit member, and which spatially filters the reading electromagnetic wave having been radiated out from each of the light emission points of the reading exposure light source, and
   the reading exposure light source section operates such that the reading electromagnetic wave, which has been radiated out from each of the light emission points and has then passed through the first optical means, diffuses in a longitudinal direction of the reading exposure light source and impinges upon the image detector, and such that several reading electromagnetic wave beams, which have been radiated out from several light emission points among the plurality of the light emission points, simultaneously impinge upon an identical site on the image detector.

4. An apparatus as defined in claim 1 or 2 wherein the image detector is supported by a surface-shaped base plate having permeability to light, the base plate being located on the side of one surface of the image detector, which one surface stands facing the pre-exposure light source section.

5. An imaging apparatus, comprising:
   i) a planar image detector, which records image information as an electrostatic latent image, and which generates electric currents in accordance with the electrostatic latent image when the planar image detector is scanned with a reading electromagnetic wave, ii) a pre-exposure light source section, which irradiates a predetermined amount of an electromagnetic wave to an entire area of the planar image detector before the electrostatic latent image is recorded on the planar image detector, iii) a reading exposure light source section, which produces the reading electromagnetic wave and scans the planar image detector with the reading electromagnetic wave, and iv) current detecting means for detecting the currents flowing out of the planar image detector in accordance with the electrostatic latent image, which has been recorded on the planar image detector, when the planar image detector is scanned with the reading electromagnetic wave, the planar image detector, the pre-exposure light source section, the reading exposure light source section, and the current detecting means being accommodated within a single same case housing, the reading exposure light source section also acting as the pre-exposure light source section.

6. An apparatus as defined in claim 1, 2, or 5 wherein a high-voltage electric power source for applying a high voltage of at least 1 kV across the image detector is located within the case housing, and the high-voltage electric power source is located in the vicinity of a connecting position of a grounding side and a connecting position of a hot side.

7. An apparatus as defined in claim 1, 2, or 5 wherein a scattered ray removing grid is located at a position within the case housing, which position stands facing a side of the image detector opposite to a side facing the pre-exposure light source section.

8. An apparatus as defined in claim 1, 2, or 5 wherein the apparatus further comprises a support post for image recording, and the case housing is supported by the support post for image recording such that the case housing is capable of being moved vertically.

9. An apparatus as defined in claim 1, 2, or 5 wherein the apparatus further comprises a support post for image recording, and a moving section supported by the support post for image recording such that the moving section is capable of being moved at least in one direction, which is among a vertical direction, a rotating direction, a horizontal direction, and a forward-reverse direction, and the case housing is supported by the moving section.

\* \* \* \* \*